(12) United States Patent  
Chen et al.

(10) Patent No.: US 8,980,669 B2
(45) Date of Patent: Mar. 17, 2015

(54) METHOD AND STRUCTURE FOR A MICRO-MECHANICAL DEVICE CONTAINING LIQUID THEREON

(71) Applicant: Sagatek Co., Ltd., Taipei (TW)

(72) Inventors: Jung-Hsiang Chen, Taipei (TW); Cheng-Szu Chen, Taipei (TW); Bo-Ting Chen, Taipei (TW)

(73) Assignee: Sagatek Co., Ltd., Taipei (TW)

( * ) Notice: Subject to any disclaimer, the term of this patent is extended or adjusted under 35 U.S.C. 154(b) by 0 days.

(21) Appl. No.: 14/078,598

(22) Filed: Nov. 13, 2013

(65) Prior Publication Data

US 2014/0256077 A1    Sep. 11, 2014

(30) Foreign Application Priority Data

Mar. 7, 2013    (TW) .............................. 102108095 A

(51) Int. Cl.
*H01L 21/00* (2006.01)
*H01L 21/30* (2006.01)
*B81C 3/00* (2006.01)

(52) U.S. Cl.
CPC ..................................... *B81C 3/001* (2013.01)
USPC ............. 438/51; 438/106; 438/125; 438/127; 438/456

(58) Field of Classification Search
None
See application file for complete search history.

(56) References Cited

U.S. PATENT DOCUMENTS

2010/0295138 A1* 11/2010 Montanya Silvestre et al. .............................. 257/415

* cited by examiner

*Primary Examiner* — Scott B Geyer
(74) *Attorney, Agent, or Firm* — Bacon & Thomas, PLLC

(57) ABSTRACT

The present invention discloses an adhesive-free method for preparation of micro electro-mechanical structure, comprising forming a micro electro-mechanical structure on a first substrate, forming an enclosing space for immersing liquid on the first or second substrate, and applying pressure to fix the first and second substrate. Before applying the pressure, the assembly including the two substrates is flipped, to make the contact surface immersed by the immersing liquid.

26 Claims, 4 Drawing Sheets

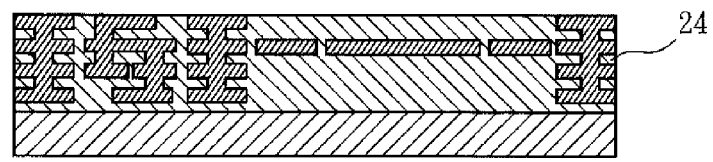
Fig. 3A
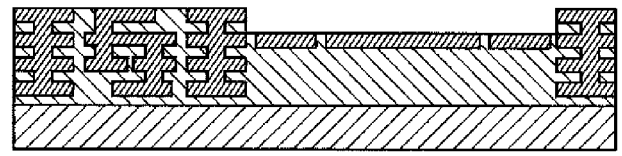
Fig. 3B
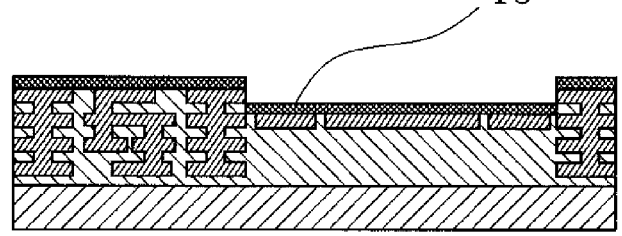
Fig. 3C
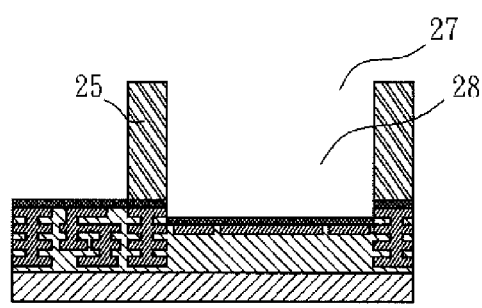
Fig. 3D
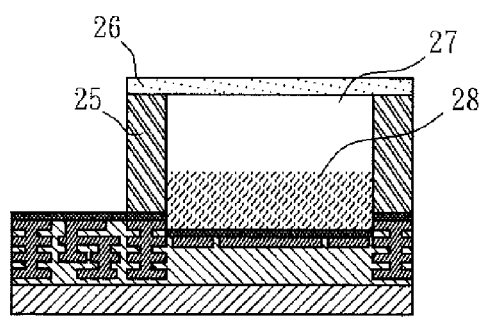
Fig. 3E
Fig. 3

METHOD AND STRUCTURE FOR A MICRO-MECHANICAL DEVICE CONTAINING LIQUID THEREON

FIELD OF THE INVENTION

The present invention relates to a new method for preparation of micro electro-mechanical structure, especially to a method for a micro electro-mechanical structure containing liquid therein. The present invention also discloses micro electro-mechanical structure prepared according to the invented method.

BACKGROUND OF THE INVENTION

In some applications of the micro electro-mechanical structure, it is necessary to provide fluid in the structure, in order to utilize the characters of the fluid to provide certain functions. One example of these applications is the liquid capacitive micro inclinometer.

Taking the liquid capacitive micro inclinometer as an example, in the preparation of such a micro electro-mechanical structure, the microstructure is first formed on a substrate. The structure may further include relative circuits. Then a second substrate, preferably a glass substrate, is prepared. An enclosing space is formed on the second substrate. Fluid is then added into the enclosing space or in the microstructure. The two substrates are combined and fixed to obtain the desired inclinometer. Such process may also be used to prepare other micro electro-mechanical structures wherein fluid is used.

One example of the microstructure so prepared is described in Taiwan patent application No. 101135550, "Liquid capacitive micro inclinometer," by the assignee of this application.

In the process described above, adhesives are used to fix the two substrates, i.e., the microstructure side substrate and the enclosing space substrate. Although there are adhesives of a variety of types usable in this process, the compatibility of the adhesive becomes one technical problem to be solved. This is because in the interface of the two substrates, materials of different physical and chemical characters are included. In addition, the photoresist materials are often used in the enclosing space side. It is difficult to select a particular adhesive that is compatible with all these materials, so to fix the two sides. In nature, micro electro-mechanical structures are structures in very tiny scale. For structures in such small scale, slight incompatibility in the interface of the two side would lead to leakage of the fluid during preparation, storage, shipment and use.

In addition, when the microstructure side substrate and the enclosing space side substrate are combined, heat and/or high pressure are used in adhering, setting and annealing. The high temperature or high pressure would gasify the fluid, leading to further leakage of the fluid, due to high gaseous pressure. The leakage does not only increase the cleaning costs but also damage the preciseness and correctness in measurement of the micro electro-mechanical components. In other words, yield rate in the preparation of the micro electro-mechanical components is damaged.

Therefore, it is necessary to provide a novel method for the preparation of micro electro-mechanical structure, without the need of adhesives in the combination of the microstructure side assembly and the enclosing space side assembly.

It is also necessary to provide a new method for the preparation of micro electro-mechanical structure that prevents leakage of fluid during the process.

Objectives of the Invention

The objective of this invention is to provide a novel method for the preparation of micro electro-mechanical structure, without the need of adhesives in the combination of the microstructure side assembly and the enclosing space side assembly.

Another objective of this invention is to provide an adhesive-free method for the preparation of micro electro-mechanical structure that includes a fluid in its structure.

Another objective of this invention is to provide a method for the preparation of micro electro-mechanical structure that prevents leakage of fluid during the process.

SUMMARY OF THE INVENTION

According to the present invention, a novel method for the preparation of micro electro-mechanical structure is provided. The method includes the steps of:

preparing a micro electro-mechanical structure on a first substrate;

forming partition walls on the first substrate, so that the partition walls define an enclosing chamber;

introducing a fluid in the enclosing chamber;

overlapping the first substrate with a second substrate;

flipping the assembly of the first and second substrates, so that a contact surface of the partition walls and the second substrate is positioned below the surface of the fluid;

applying pressure to the first and second substrate, so to weld the contact surface.

In some embodiments, the method further includes the step of annealing the assembly so obtained.

In other embodiments of this invention, the enclosing space is formed on the second substrate. In such embodiments, the method comprises the steps of:

preparing a micro electro-mechanical structure on a first substrate;

forming partition walls on a second substrate to define an enclosing chamber;

introducing a fluid in the micro electro-mechanical structure or the enclosing chamber;

overlapping the first substrate with the second substrate, so that the micro electro-mechanical structure is enclosed in the enclosing chamber;

optionally flipping the assembly of the first and second substrates, so that a contact surface of the partition walls and the second substrate is positioned below the surface of the fluid;

applying pressure to the first and second substrate, so to weld the contact surface.

In some embodiments, the method further includes the step of annealing the assembly so obtained.

In some particular embodiments, the method further comprises the step of forming a circuit structure on the first substrate, wherein the circuit structure is in connection with the micro electro-mechanical structure.

In the preferred embodiments of this invention, the first substrate may include any material suited in the semiconductor preparation process, such as the silicon substrate. The partition walls may be made of any material that is able to maintain the gaseous pressure inside the enclosing chamber. A preferred material for the partition walls is the photoresist material. In addition, the second substrate may be a silicon, glass, metal, metal oxide, plastic, rubber, resin material or their combinations. In the enclosing chamber, a lubrication layer may be formed on the surface of the chamber. Material for the lubrication layer may be any surfactant, such as Teflon. Fluid applicable in this invention includes any fluid suited for the preparation of the micro electro-mechanical structure. The fluid may be conductive or non-conductive. In the preferred embodiments of this invention, silicone oil is used as the fluid. Pressure applied to the two substrates in the combination step may be determined according to type and compositions of the fluid and characters of the partition walls and the material at the contact surface.

These and other objectives and advantages of this invention may be clearly understood from the following detailed description by referring to the following drawings.

BRIEF DESCRIPTION OF THE DRAWINGS

FIGS. 3A to 3E respectively show the main steps of the method for preparation of micro electro-mechanical structure according to this invention.

DETAILED DESCRIPTION OF THE INVENTION

In the followings detailed description of the invented method for preparation of micro electro-mechanical structure will be given by its preferred embodiments. It is appreciated that description to the preferred embodiments serves to illustrate examples of the present invention, without limitation to its scope of protection.

The present invention may be used to fabricate any micro electro-mechanical structure containing a fluid in the structure. The micro electro-mechanical structure may be a detector and the fluid may be a liquid. An example of the micro electro-mechanical structure that may be fabricated in accordance with the present invention is the liquid capacitive micro inclinometer. For this and other reasons, in the following descriptions the liquid capacitive micro inclinometer will be taken as example in describing the invented method for preparation of micro electro-mechanical structure.

Figure 1:
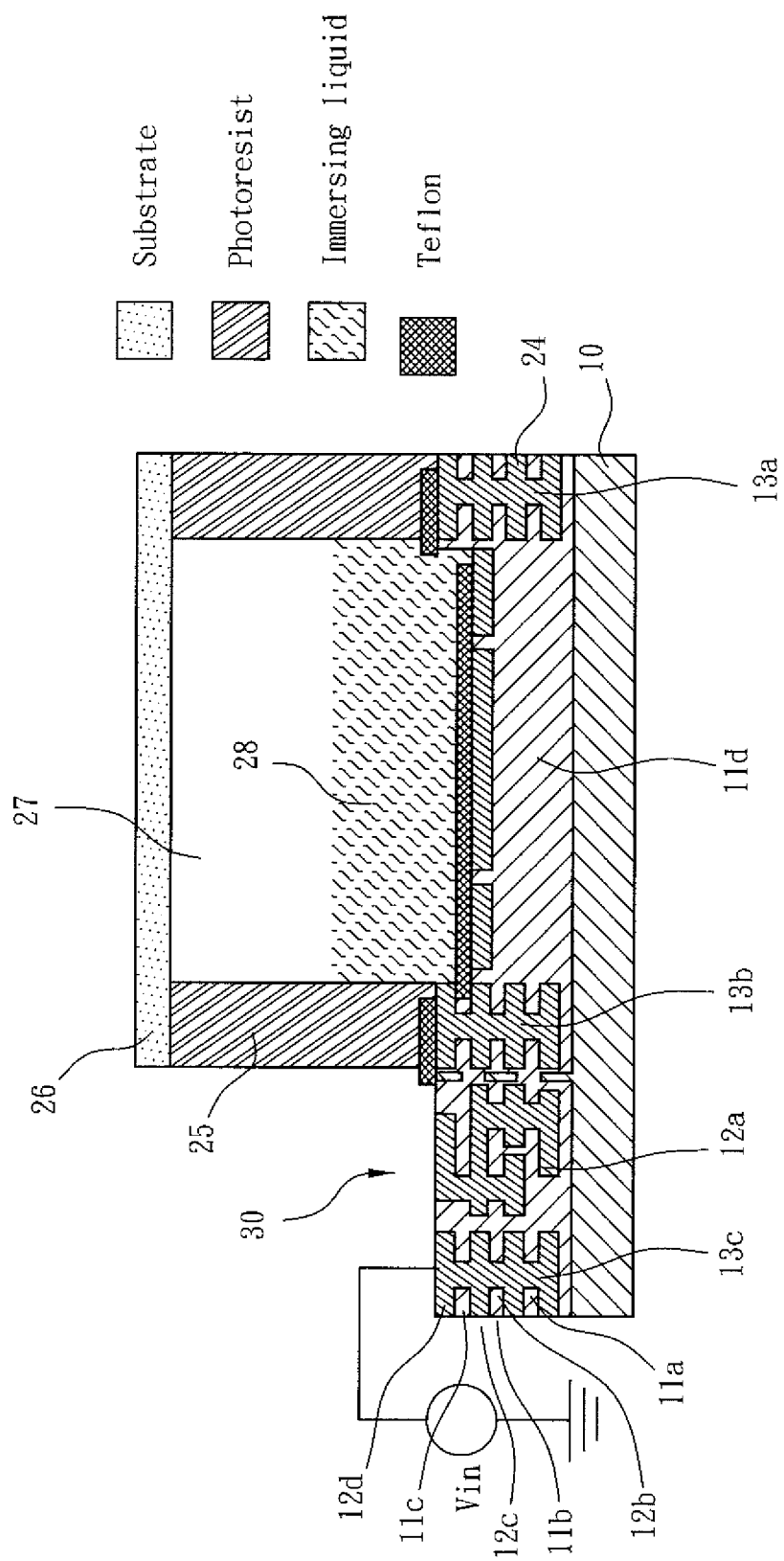
FIG. 1 illustrates the cross-sectional view of a liquid capacitive micro inclinometer, prepared in accordance with the invented method.

FIG. 1 illustrates the cross-sectional view of a liquid capacitive micro inclinometer, prepared in accordance with the invented method. As shown in this figure, the liquid capacitive micro inclinometer 200 is prepared on a first substrate 10. The first substrate 10 shown in FIG. 1 is a substrate commonly used in the standard CMOS process, i.e., the silicon substrate. On the first substrate 10, a plurality of dielectric layers 11a, 11b, 11c, 11d, a plurality of metal layers 12a, 12b, 12c, 12d and a plurality of vias 13a, 13b, 13c are formed by the standard CMOS manufacturing process.

The inclinometer 100 has a pair of differential electrodes and a common electrode. In the inclinometer shown in FIG. 1, the 3 electrodes (not shown) are formed in the same metal layer, i.e. the third metal layer 12c. Support structure 24 including a plurality of dielectric layers, a plurality of metal layers and a plurality of vias surrounds the 3 electrodes. Partition walls 25 are formed on the support structure 24 and are covered by a second substrate 26, to define an enclosing chamber 27. Immersing liquid 28 is sealed in the enclosing chamber 27.

In the preferred embodiments of this invention, the partition walls 25 are prepared with a photoresist material and material for the second substrate 26 is glass. Of course, this is not any technical limitation. Other materials may also be used to prepare the partition walls 25 and the second substrate 26.

In this example, the 3 electrodes are formed in a single metal layer, while in other embodiments, the 3 electrodes are formed in a plurality of metal layers, i.e., a plurality of metal layers with dielectric layer(s) sandwiched therein, if the structure is prepared according to the standard CMOS process.

In order to prevent or reduce the immersing liquid 28 from adhering to the surface of the 4 3 electrodes, due to the capillary force, selected portions or the full surface of the 3 electrodes are applied with a lubrication layer (not shown). Suited materials for the lubrication layer are known to those having ordinary skills in the art. In some embodiments, the lubrication layer is Teflon.

The inclinometer with the structure described above may be fabricated in accordance with the standard CMOS process. Therefore, the detection circuits may be prepared on the same substrate, simultaneously when the micro electro-mechanical structure is prepared. This would simplify the fabrication process of the inclinometer and provide a solution to the integration of the detector and the detection circuits.

Figure 2:
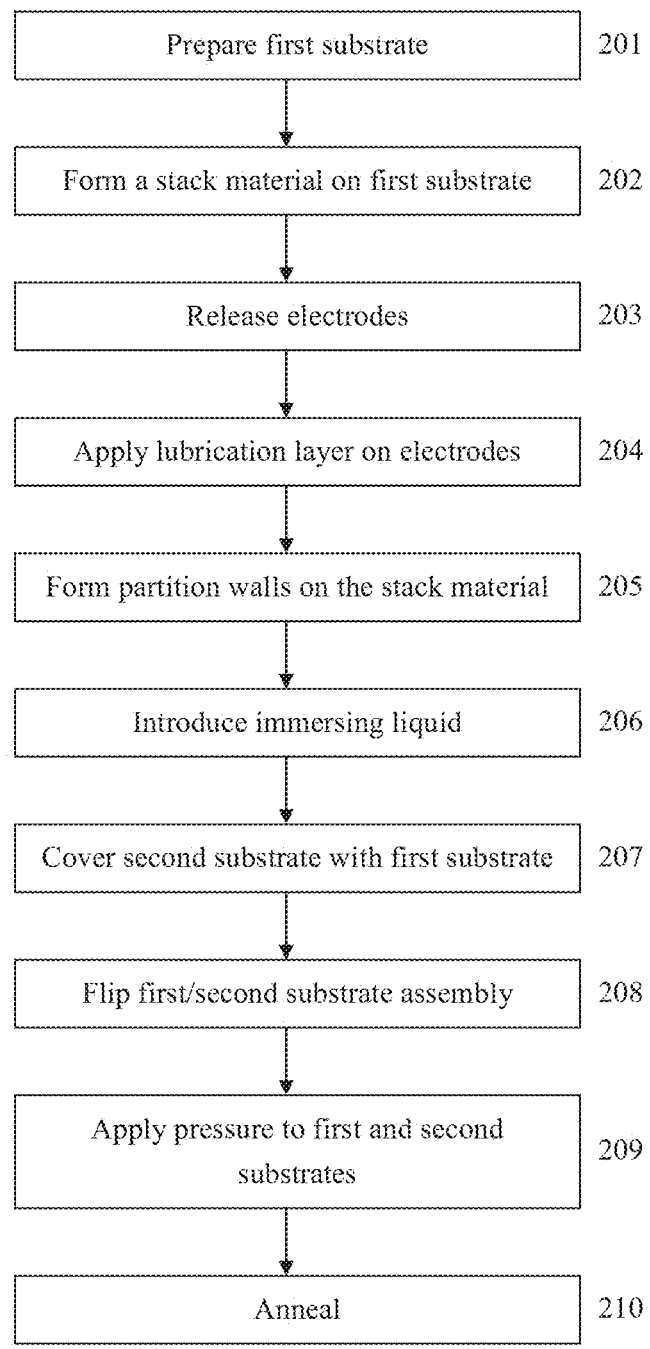
FIG. 2 shows the flowchart of the method for preparation of micro electro-mechanical structure according to one embodiment of this invention.

In the followings, examples for the invented method for preparation of micro electro-mechanical structure will be described. FIG. 2 shows the flowchart of the method for preparation of micro electro-mechanical structure according to the first embodiment of this invention. FIGS. 3A to 3E respectively show the main steps of the method shown in FIG. 2. As shown in FIG. 2, when the method of this embodiment is used to prepare the micro electro-mechanical structure, a first substrate 10 is first prepared in step 201. Material for the first substrate 10 is not limited to any particular material. As a general case, the first substrate 10 may be made of a material commonly used in the standard CMOS process, i.e., the silicon substrate. The silicon substrate is advantageous, because the micro electro-mechanical structure thus may be fabricated in the standard CMOS process. Of course, it is possible to use any other rigid material or another material usable in the standard CMOS process, to obtain identical or similar effects.

In the following, at step 202 a material stack is formed on the first substrate 10. The stack may include: a dielectric layer 11a on the substrate 10, several metal layers 12a, 12b, 12c, 12d and several dielectric layers 11b, 11c, 11d, alternatively formed on the dielectric layer 11a, and a plurality of vias 13a, 13b, 13c formed in the stack. The stack includes patters of an inclinometer (detector) 100 and a detection circuit 30. Such a stack of material may be prepared in accordance with any commercially available process that produces circuit structure and/or microstructure. Among the commercially available processes, the standard CMOS process is preferred. The detection circuit 30 may be any circuit structure designed using the commercially available design tools, such as the multilayered circuit structure prepared in the standard CMOS process. The detection circuit 30 detects variations in capacitance and converts the detection results into signals representing tilt angles. Detection circuits having these functions are available in the market and anyone having ordinary skills in the art may use any commercially available design tools to design the circuit and the commercially available process to form the circuit on the first substrate 10. Details thereof are thus omitted.

As to the detector 100, it includes a pair of differential electrodes and a common electrode that may be formed in one metal layer, such as the third metal layer 12c, as in this particular example. The preparation of the detector 100 may include etching the metal layer 12c to form patterns of the desired electrodes. Any method in forming patterns of electrodes may be used in forming the electrodes. In addition, it is possible to form more than one pair of differential electrodes in one plane or in substantially the same plane of the metal layers, by using the conventional art. Those having ordinary skills in the art may easily complete the preparation of the electrodes, after having read the disclosure of this patent specification and its attached drawings. Details thereof are also omitted.

The stack material may include a support structure 24 including a plurality of metal layers, a plurality of dielectric layers and a plurality of vias. In the support structure 24 the vias respectively extend through a plurality of metal layers and a plurality of dielectric layers, so to strengthen the support structure 24. The support structure 24 is designed to support an enclosing chamber inside it. Similarly, the support structure 24 may be prepared using the standard CMOS process, at the same time when the detection circuit and the electrodes are formed. Since such technologies are known in the art, details thereof are thus omitted. The structure so obtained is shown in FIG. 3A.

Following that, at step 203 the dielectric layers positioned above the electrodes are removed, until the electrodes are exposed. The resulted structure is shown in FIG. 3B. At step 204 a lubrication layer 15 is applied to the surface of the electrodes. The lubrication layer 15 may be made of any material that is capable of eliminating or reducing the capillary force of the electrodes. In the preferred embodiments of this invention, the lubrication layer 15 is a Teflon, that is, a polytetrafluoroethylene, layer. Of course, any other material that provides the same or similar functions may be used in the lubrication layer 15. The lubrication layer 15 may be applied to the surface of the electrodes using any conventional method, while spin casting is preferred. The thickness of the lubrication layer 15 is not limited, as long as preciseness or correctness in measurement is not impacted. The material structure so obtained is shown in FIG. 3C.

At step 205, partition walls 25 are formed on the stack material, such that an inclosing space 27 enclosing the detector 100 in the upper part of the stack material is formed. The formation of the partition walls 25 starts from forming a layer of partition wall material on the material stack obtained in step 204. The material of the partition wall is not limited, while in the preferred embodiments photoresist materials are used in forming the partition walls, in consideration of convenience in process. Suited photoresist materials include SU-8 and other similar materials. The partition wall material 25 is formed on the material stack using any applicable method, without any limitation in the thickness, provided that a space/chamber having sufficient volume to enclose the immersing liquid therein is defined by the partition walls 25. In general cases, the thickness of the partition wall material 25 may be between 100 and 2,000 um, preferably between 200 and 1,000 um. Later an enclosing space 27 is formed in the partition wall material 25, to enclose the immersing liquid 28. The enclosing space 27 may be formed by partially removing material from the partition wall material layer, using such as wet etching. Of course, the partition wall material may be removed using other methods, such as dry etching. If necessary, cutting lines (not shown in FIG. 3) may be formed. The structure so obtained includes the first substrate 10, the detector 100, the detection circuit 30 and partition walls 25 defining an enclosing space 27, as shown in FIG. 3D.

In the following step 206, an immersing liquid 28 is introduced into the enclosing space 27. The immersing liquid 28 may be a conductive liquid or a dielectric liquid. In case of conductive liquid, it may be one selected from an electrolyte liquid, magnetic liquid, a liquid metal, a liquid containing nano metal particles etc., or their combinations. If it is non-conductive, it may be a material of higher proportion and low viscosity, such as silicone oil. Amount of the immersing liquid 28 being introduced is not limited, while in the preferred embodiment volume of the immersing liquid 28 is approximately half of the volume of the enclosing space 27.

In the following step 207, the structure so obtained is covered by a second substrate 26. Material for the second substrate 26 is not limited, provided it is rigid and easy to process. In the preferred embodiments, the second substrate 26 is a glass substrate. Of course, other materials, such as plastic, resin, fiber glass, metal, ceramic materials or their combination may also be used in the preparation of the second substrate 26. At step 208 the assembly of the first substrate 10 with the structure prepared thereon and the second substrate 26 is flipped, so that the contact surface of the partition walls 25 and the second substrate 26 is positioned below the surface of the immersing liquid 28. Any suitable tool may be used in this step, to prevent the immersing liquid 28 from leakage through the contact surface of the partition walls 25 and the second substrate 26. Any method to maintain the immersing liquid 28 in the enclosing space, now enclosing chamber, may be used. Clamping the second substrate 26 tightly against the first substrate 10 during the flipping of the assembly is one good example.

At step 209 pressure is applied to the first substrate 10 and the second substrate 26, in a manner sufficient to melt and weld the contact surface and affix the two substrates. Thereafter, at step 210 the assembly is heated to anneal the welding, if necessary. The temperature, duration and time of the annealing may be determined in accordance with the conditions of the assembly.

Although it is not intended to limit the present invention by any theory, it is found that the photoresist materials are in particular suited in the preparation of the partition walls 25 of this invention. It may be because the negative photoresist agents tend to generate crosslinking in its internal molecular structure, when exposed. The crosslinking would strengthen the photoresist structure and the crosslinking structure would be further strengthened, if thermal process follows. In other words, by applying pressure to the photoresist material, the crosslinking photoresist molecular would adhere to surface in contact. Experiment results show that the PerMX dry photoresist in combination with SU-8 photoresist, both supplied by DuPont, provides outstanding effects in affixing the partition walls and the second substrate.

Figure 4:
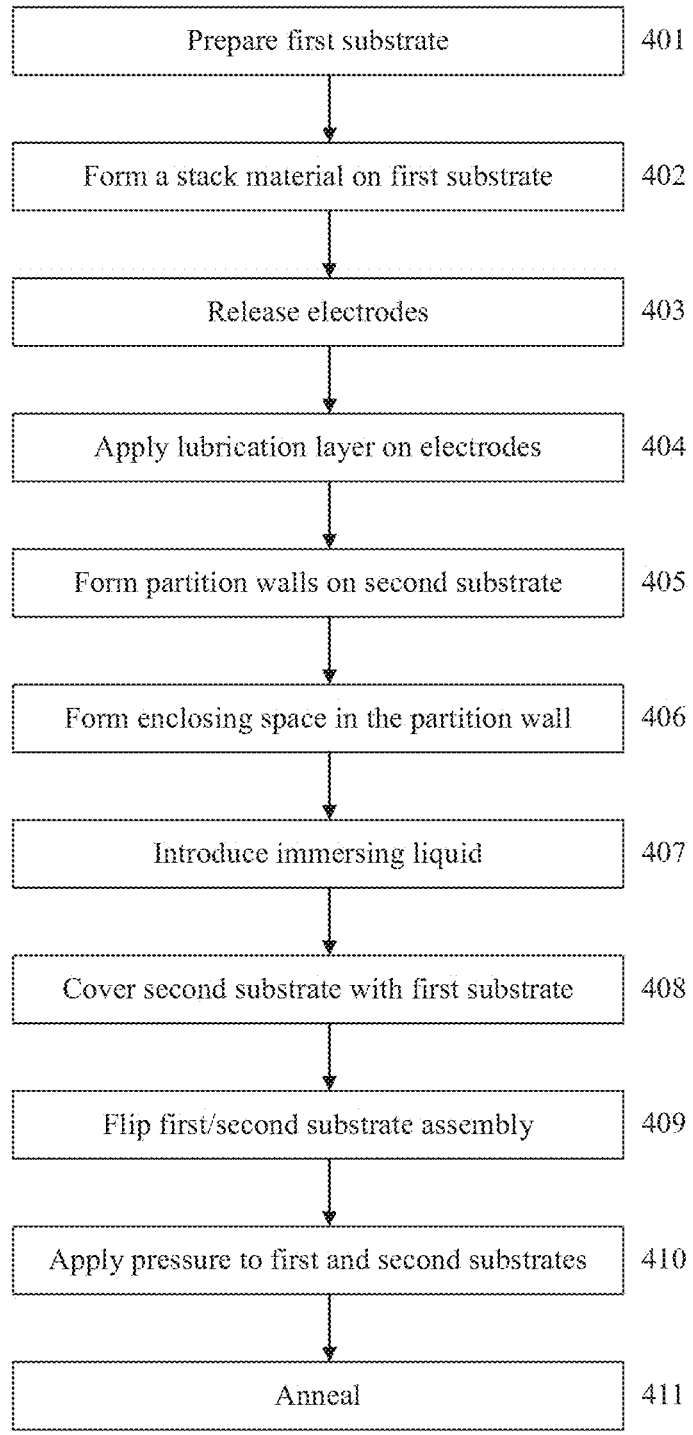
FIG. 4 shows the flowchart of the method for preparation of micro electro-mechanical structure according to another embodiment of this invention.

The micro electro-mechanical structure so obtained is shown in FIG. 3E. In another embodiment of this invention, the partition walls 25 are formed on the second substrate 26. This approach also supports the invented method for preparation of micro electro-mechanical structure. FIG. 4 shows the flowchart of the method for preparation of micro electro-mechanical structure according to the second embodiment of this invention.

As shown in FIG. 4, in the preparation of the inclinometer according to the method of the second embodiment, at step 401a first substrate 10 is prepared. At step 402 a stack of material is formed on the first substrate 10. This stack includes a dielectric layer 11a on the substrate 10, several metal layers 12a, 12b, 12c, 12d and several dielectric layers 11b, 11c, 11d, alternatively formed on the dielectric layer 11a, and a plurality of vias 13a, 13b, 13c formed in the stack. The stack may include a detector part 100 and a detection circuit 30. The detector part 100 includes at least one pair of differential electrodes and a common electrode. At step 403 dielectric layer above the electrodes are removed, until the electrodes are exposed. At step 404 a lubrication layer 15 is applied on the surface of the electrodes.

In the following, at step 405 a partition wall material layer 25 is formed on a second substrate 26. The material and thickness of the partition wall material layer is the same as that of the first embodiment. Then at step 406 an enclosing space 27 is formed in the partition wall material layer 25, to function as enclosing chamber for immersing liquid 28. Method for forming the enclosing space 27 is the same as that of the first embodiment. If necessary, cutting lines may be form in the partition wall material layer 25.

Thereafter, at step 407 immersing liquid 28 is introduced into the recess formed in the stack on the first substrate 10 after portions of the partition wall material are removed or in the enclosing space 27 on the second substrate 26. Volume of the immersing liquid 28 is not limited but is preferably approximately half of the volume of the enclosing space 28. At step 408, the second substrate 26 is flipped to overlap the material stack of the first substrate 10, so that the exposed electrodes face the enclosing space 28, if the immersing liquid was introduced into the recess formed on the first substrate 10 at step 407. If in step 407 the immersing liquid was introduced into the enclosing space 28, in step 408 the first substrate 10 is flipped to cover the enclosing space 28 of the second substrate 26, so that the exposed electrodes face the enclosing space 28. In the resulted assembly, the material stack on the first substrate 10 and the enclosing space 28 on the second substrate 26 jointly define an enclosing chamber.

In the following, if necessary, at step 409 the assembly of the first substrate 10 as well as its material stack and the second substrate 26 is flipped, so that the contact surface of the partition walls 25 and the material stack of the first substrate 10 is positioned below the surface of the immersing liquid 28. To be precise, if after step 408 the contact surface is already positioned below the surface of the immersing liquid 28, the assembly is not flipped. In this step 409, necessary tools may be used to prevent the immersing liquid from leakage via the contact surface.

At step 410 pressure is applied to the first substrate 10 and the second substrate 20, in a manner that the contact surface melts and is welded. The method, reaction conditions, parameters for this step are all the same as that of the first embodiment. If necessary, the assembly so obtain is annealed in step 411. The micro electro-mechanical structure so obtained is shown in FIG. 3E.

In the above-described embodiments, suited immersing liquid may be any fluid used in the fabrication and application of micro electro-mechanical structures. The liquid may be either a liquid or a sticky substance and may be conductive or non-conductive. In the described embodiments, the immersing liquid is silicone oil. The present invention provides a simplified method for the preparation of micro electro-mechanical structures. No adhesives are needed in the invented method. The invented method does not only reduce the fabrication cost of the micro electro-mechanical structure but also prevent the immersing liquid from leakage during process, storage, shipment and use.

What is claimed is:

1. A method for preparation of a micro electro-mechanical structure, comprising the steps of:

forming a micro electro-mechanical structure on a first substrate;

forming partition walls on the first substrate, to define an enclosing space containing the micro electro-mechanical structure;

introducing a fluid into the enclosing space;

covering the enclosing space with a second substrate;

flipping the assembly including the first and second substrates, so that contact surface of the partition walls and the second substrate is positioned below a surface of the fluid; and applying a pressure to the first and second substrates to weld the contact surface.

2. The method according to claim 1, further comprising a step of annealing the welding.

3. The method according to claim 1, wherein the step of forming the micro electro-mechanical structure further includes forming a circuit structure in connection with the micro electro-mechanical structure.

4. The method according to claim 3, wherein the micro electro-mechanical structure includes a detector and the circuit structure includes a detection circuit.

5. The method according to claim 1, wherein the partition walls include a photoresist material used in semiconductor fabrication process.

6. The method according to claim 5, wherein the partition walls include a negative photoresist material.

7. The method according to claim 1, wherein the second substrate includes at least a material selected from the group consisted of silicon, glass, metal, metal oxides, plastic, rubber and resin.

8. The method according to claim 1, further comprising the step of forming a lubrication layer in the enclosing space, after the enclosing space is formed.

9. The method according to claim 8, wherein the lubrication layer includes polytetrafluoroethylene.

10. The method according to claim 1, wherein the fluid is a liquid.

11. The method according to claim 10, wherein the liquid is a conductive liquid.

12. The method according to claim 10, wherein the liquid is a non-conductive liquid.

13. The method according to claim 10, wherein the liquid includes silicone oil.

14. A method for preparation of a micro electro-mechanical structure, comprising the steps of:

forming a micro electro-mechanical structure on a first substrate;

forming partition walls on a second substrate, to define an enclosing space;

introducing a fluid into the enclosing space;

covering the enclosing space with the first substrate, so that the micro electro-mechanical structure is enclosed in the enclosing space;

flipping the assembly including the first and second substrates, so that contact surface of the partition walls and the second substrate is positioned below a surface of the fluid; and applying a pressure to the first and second substrates to weld the contact surface.

15. The method according to claim 14, further comprising a step of annealing the welding.

16. The method according to claim 14, wherein the step of forming the micro electro-mechanical structure further includes forming a circuit structure in connection with the micro electro-mechanical structure.

17. The method according to claim 16, wherein the micro electro-mechanical structure includes a detector and the circuit structure includes a detection circuit.

18. The method according to claim 14, wherein the partition walls include a photoresist material used in semiconductor fabrication process.

19. The method according to claim 18, wherein the partition walls include a negative photoresist material.

20. The method according to claim 14, wherein the second substrate includes at least a material selected from the group consisted of silicon, glass, metal, metal oxides, plastic, rubber and resin.

21. The method according to claim 14, further comprising the step of forming a lubrication layer on at least a portion of the micro electro-mechanical structure, after the micro electro-mechanical structure is formed.

22. The method according to claim 21, wherein the lubrication layer includes polytetrafluoroethylene.

23. The method according to claim 14, wherein the fluid is a liquid.

24. The method according to claim 23, wherein the liquid is a conductive liquid.

25. The method according to claim 23, wherein the liquid is a non-conductive liquid.

26. The method according to claim 23, wherein the liquid includes silicone oil.

\* \* \* \* \*